United States Patent
Casalnuovo et al.

(10) Patent No.: US 6,232,139 B1
(45) Date of Patent: May 15, 2001

(54) METHOD OF MAKING SUSPENDED THIN-FILM SEMICONDUCTOR PIEZOELECTRIC DEVICES

(75) Inventors: Stephen A. Casalnuovo, Albuquerque; Gregory C. Frye-Mason, Cedar Crest, both of NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 09/240,780

(22) Filed: Jan. 29, 1999

(51) Int. Cl.[7] .................................................. H01L 21/00
(52) U.S. Cl. ........................ 438/48; 438/49; 438/745; 438/DIG. 928; 438/DIG. 970
(58) Field of Search ...................... 438/49, 48, DIG. 928, 438/DIG. 970, 745

(56) References Cited

U.S. PATENT DOCUMENTS

| | | |
|---|---|---|
| 5,095,401 * | 3/1992 | Zavracky et al. . |
| 5,225,705 * | 7/1993 | Hiyama et al. . |
| 5,395,802 * | 3/1995 | Kiyota et al. . |
| 5,493,470 * | 2/1996 | Zavracky et al. . |
| 5,631,198 * | 5/1997 | Hartauer . |

OTHER PUBLICATIONS

Fukuyama et al., "Piezoelectric photoacoustic study of AlGaAs epitaxial layer grown on semi–insulating GaAs substrate", Oct. 1998, Uttrasonics Symposium, 1998. Proceedings., 1998 IEEE, vol. 2, pp. 1235–1238.*

Stokes & Cawford, "X–Band Thin Film Acoustic Filters on GaAs", Jul. 1993, Microwave Theory and techniques, IEEE transactions on, pp. 1075–1080.*

* cited by examiner

Primary Examiner—Charles Bowers
Assistant Examiner—Evan Pert
(74) Attorney, Agent, or Firm—Gregory A. Cone

(57) ABSTRACT

A process for forming a very thin suspended layer of piezoelectric material of thickness less than 10 microns. The device is made from a combination of GaAs and AlGaAs layers to form either a sensor or an electronic filter. Onto a GaAs substrate is epitaxially deposited a thin (1–5 micron) sacrificial AlGaAs layer, followed by a thin GaAs top layer. In one embodiment the substrate is selectively etched away from below until the AlGaAs layer is reached. Then a second selective etch removes the sacrificial AlGaAs layer, that has acted here as an etch stop, leaving the thin suspended layer of piezoelectric GaAs. In another embodiment, a pattern of small openings is etched through the thin layer of GaAs on top of the device to expose the sacrificial AlGaAs layer. A second selective etch is done through these openings to remove the sacrificial AlGaAs layer, leaving the top GaAs layer suspended over the GaAs substrate. A novel etchant solution containing a surface tension reducing agent is utilized to remove the AlGaAs while preventing buildup of gas bubbles that would otherwise break the thin GaAs layer.

21 Claims, 4 Drawing Sheets

METHOD OF MAKING SUSPENDED THIN-FILM SEMICONDUCTOR PIEZOELECTRIC DEVICES

STATEMENT REGARDING FEDERALLY SPONSORED RESEARCH OR DEVELOPMENT

This invention was made with Government support under Contract DE-AC04-94AL85000 awarded by the U.S. Department of Energy. The Government has certain rights in the invention.

CROSS-REFERENCE TO RELATED APPLICATIONS

Not applicable.

BACKGROUND OF THE INVENTION

This invention relates to methods of making very thin, suspended layers of compound semiconductor materials, typically utilizing the GaAs/AlGaAs system. More particularly, this invention relates to methods of etching compound semiconductors to achieve thicknesses in the range of 10 microns or less for relatively large surface area layers. Still more particularly, this invention relates to methods of forming acoustic wave chemical microsensors and high frequency electronic filters made by these micromachining techniques.

GaAs and quartz have been used as the piezoelectric acoustic wave elements for chemical sensors for many years. If a coating that is selective for a chemical analyte of interest is placed on the surface of the piezoelectric element and the coating is then presented to a fluid mixture that may contain the analyte, the resonant frequency of the coated sensor will change as the analyte builds up on the element. One class of these sensors is of the type known as surface acoustic wave (SAW) sensors in which a relatively thick substrate layer of quartz or GaAs is utilized. In this class of sensors, the acoustic wavelength is small compared to the substrate thickness. The chemical sensitivity of the SAW device scales inversely with acoustic wavelength and is therefor greatest for the smallest possible wavelength. The SAW wavelength is determined by the width of and the spacing between the interdigitated electrodes used to drive the acoustic wave in the crystal. Therefor, the chemical sensitivity of the SAW device is limited by the resolution of the microlithography process that sets a lower limit on the acoustic wavelength. In commonly used configurations, the area occupied by this sensor scales as the square of the acoustic wavelength, decreasing as the wavelength decreases and the sensitivity increases. The acoustic frequency of this sensor is determined by the acoustic wavelength of the device and the acoustic velocity of the substrate material such that the frequency increases as the wavelength decreases and the sensitivity increases.

A second class of these sensors is of the type known as flexural plate wave (FPW) sensors. This class of sensors differs from SAW sensors in that the acoustic wavelength is comparable to or greater than the thickness of the substrate. For this class of sensors, the chemical sensitivity of the sensor increases as the thickness of the substrate decreases with constant acoustic wavelength. Therefor, the chemical sensitivity is limited by the ability to make thin substrates and is independent of the microlithography process used to form the interdigitated electrodes. The frequency of this device decreases for decreasing substrate thickness and increasing sensitivity. As with the SAW sensor, the area occupied by this sensor scales as the square of the wavelength.

A third class of these sensors is of the type known as thickness shear mode (TSM) sensors in which again a relatively thick substrate layer of quartz or GaAs is utilized in typical devices. In this class of sensors, the chemical sensitivity scales inversely with the thickness of the substrate, increasing for thinner substrates. As with the FPW sensor, the chemical sensitivity is limited by the ability to make thin substrates and is independent of the microlithography process used to form the electrodes. In commonly used configurations, the area occupied by this device scales inversely with the sensitivity, decreasing with increasing sensitivity and decreasing substrate thickness.

There exists a need in the art for a process to create thinner piezoelectric layers to increase chemical sensor sensitivity and to decrease area occupied by the sensor. In some applications, this need is coupled with an additional need to decrease the sensor frequency while in other applications this need is coupled with an additional need to increase the sensor frequency. Further, there exists a need in the art for a process to create acoustic wave chemical microsensors with increased performance in a manner that is compatible with the monolithic integration of microelectronic circuits that can control the sensors and extract data from them.

These same piezoelectric materials can also be used as signal processing and signal conditioning components in high frequency electronic circuit applications, particularly filters. The same structures used in microsensor devices, namely SAW, FPW, and TSM structures, provide the signal processing and conditioning function. In this case, the devices do not require the application of chemically selective layers. As with the sensors, the operating frequency for some of these devices will increase as the substrate thickness decreases and the area occupied by these devices will decrease as the substrate thickness decreases. As with the sensors, there exists a need in the art for a process to create thinner piezoelectric layers to increase the operating frequency and reduce the size of electronic filters. In addition, there exists a need for the monolithic integration of the improved filters with microelectronic circuits.

BRIEF SUMMARY OF THE INVENTION

This invention is a process for constructing chemical microsensors and electronic circuit filters, among other things, on thin regions of piezoelectric compound semiconductor substrates in a manner that is compatible with the monolithic integration of microelectronic circuits. The thinning process produces piezoelectric material that is sufficiently thinner than other methods, resulting in devices with characteristics that are improved many-fold when compared to existing devices.

In brief, first and second epitaxial layers are grown on a substrate. In one embodiment, the backside of the substrate is selectively patterned and etched away to expose the base of the first epitaxial layer. The first epitaxial layer is then selectively etched away from below to leave only the second epitaxial layer, which is then contacted by electrodes either on its top side only or on both its top and bottom sides. In another embodiment, the top of the second epitaxial layer is selectively patterned and etched down to the level of the first epitaxial layer. A second etching solution is then introduced through the openings in the second epitaxial layer to etch away the first epitaxial layer in the regions proximate to the etched openings in the second epitaxial layer. As a result, the second layer, in the area between the etched openings therein, is suspended above the substrate. The thickness of the suspended layer is typically less than about 10 microns and the ratio of the length of the suspended layer to its thickness is typically greater than 100:1. Electrodes are then emplaced either on the top side or on the top and bottom sides thereof. In either embodiment, this remaining second epitaxial layer can be made wide, long and uniformly thin to optimize its acoustic properties.

DETAILED DESCRIPTION OF THE INVENTION

Figure 1:
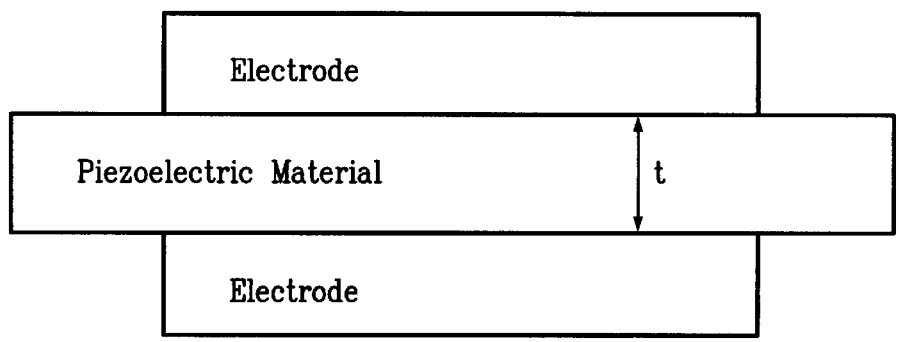
FIG. 1 is a schematic side view representation of a piezoelectric device, the vertical dimension is exaggerated.
Figure 2:
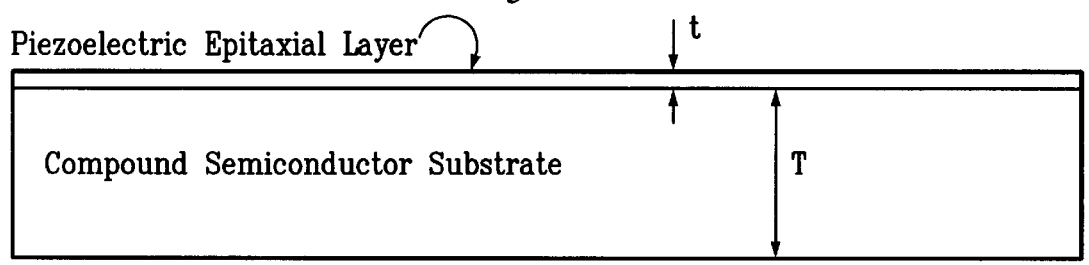
FIG. 2 is a schematic side view of an epitaxial layer grown on a substrate.
Figure 3:
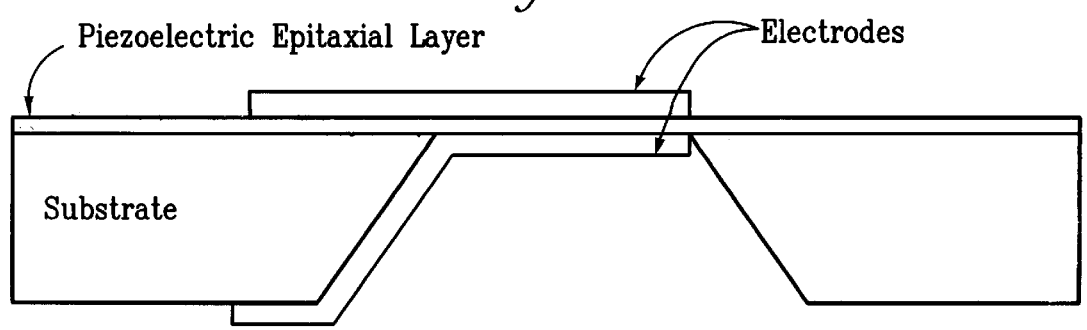
FIG. 3 is a schematic side view of one design for a microsensor or electronic filter using a thin epitaxial layer suspended between edges of a substrate.

Piezoelectric chemical microsensors and piezoelectric electronic filters can be represented as a layer of piezoelectric material whose thickness is small compared to its lateral extent, coated on either one or both faces by an electrically conducting material, typically a metal, that makes electrical connection to the piezoelectric material. This is shown schematically in FIG. 1. As mentioned above, device performance improves for some classes of sensors and filters as the thickness of the piezoelectric layer is reduced. For compound semiconductor materials that, in general, are piezoelectric, it is possible to produce thin layers of piezoelectric material on a suitable substrate through processes collectively referred to as epitaxial growth. Epitaxial growth alone cannot produce the required thin piezoelectric material because the effective thickness of the piezoelectric material is the sum of the epitaxial layer thickness, which is quite thin, and the substrate thickness, which is relatively thick, as illustrated in FIG. 2 for a conventional SAW device. However, the proper and unique combination of substrate selection, epitaxial growth, photolithographic patterning, pattern etching, and metal deposition, all established processes in compound semiconductor microelectronics fabrication technology set forth herein, can produce isolated regions of the thin epitaxial layer that are similar in cross section to the ideal case shown in FIG. 1. One embodiment of the process results in the structure shown in FIG. 3 (but with a sacrificial epitaxial layer omitted for simplicity).

The lateral dimensions of the thin piezoelectric layer must be large enough to contain the device of interest. Given how thin the piezoelectric layer must be for improved device performance, this is a non-trivial constraint. The mechanical strength of the piezoelectric layer must be sufficient to survive the fabrication process and device use.

Figure 4:
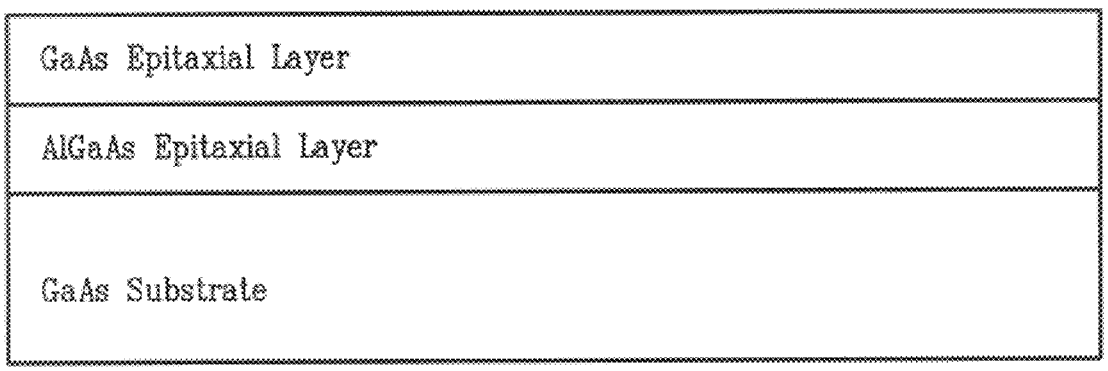
FIG. 4 is a schematic side view, not to scale, of one sequence of starting materials for a piezoelectric device.

One embodiment of the invention is illustrated in the structure shown in FIG. 4. In this example, a gallium arsenide (GaAs) substrate has had two epitaxial layers grown sequentially on one surface of the substrate. The first layer is an aluminum gallium arsenide (AlGaAs) alloy that is typically a few microns thick and contains at least 37 atomic percent aluminum (Al). A GaAs epitaxial layer, also a few microns thick, is grown on top of the AlGaAs layer. Both GaAs and AlGaAs are piezoelectric. This GaAs/AlGaAs/GaAs sandwich is the starting point for two different embodiments of this invention for producing thin suspended piezoelectric material.

Figure 5:
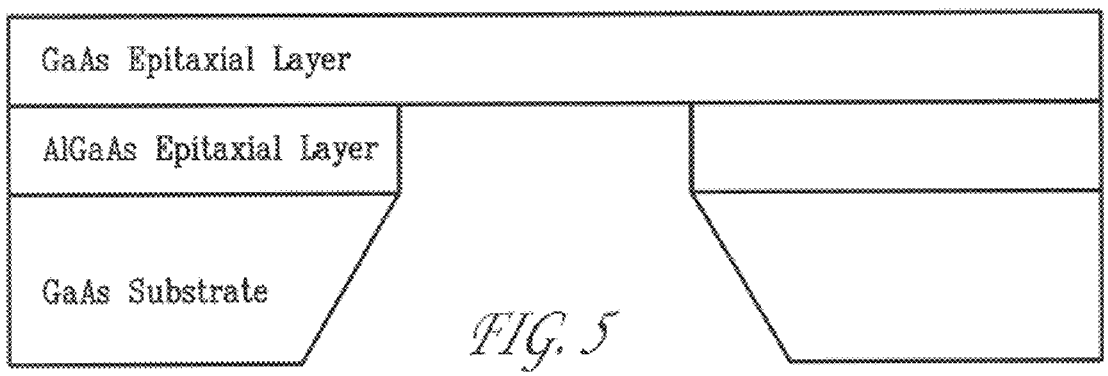
FIG. 5 is a schematic side view, not to scale, of a suspended piezoelectric layer formed from the starting materials of FIG. 4.

In the first embodiment, the exposed bottom surface of the GaAs substrate is photolithographically patterned to protect all but a selected region of this surface. This exposed region is then etched in a chemical mixture (for example, citric acid, hydrogen peroxide and water will work, as will other known etching solutions for GaAs) that dissolves GaAs much faster than AlGaAs. This has the effect of etching through the GaAs substrate and stopping on the AlGaAs layer. The etchant is then changed to one that dissolves the AlGaAs much faster than GaAs (for example, hydrofluoric acid). This removes the AlGaAs layer and leaves only the top most GaAs epitaxial layer suspended over the opening in the GaAs substrate. This is shown in FIG. 5. The resulting suspended GaAs layer has an extremely uniform thickness, owing to the thickness control of the epitaxial growth process and the highly selective hydrofluoric acid etch (not shown). Metal electrodes, typically gold, are then deposited on the top surface or on both the top and bottom surfaces of the GaAs epitaxial layer to form the microsensor or filter. Other compound semiconductors besides GaAs can be used for the suspended layer, e.g., indium gallium arsenide (InGaAs). The criterion in this embodiment is that the alternative compound semiconductor have a reaction to the various etchants that is similar to that of GaAs.

A second approach to achieve this embodiment can be accomplished with the growth on the GaAs substrate of a single epitaxial layer of AlGaAs that is typically a few microns thick and contains at least 37 atomic percent Al. As before, the exposed bottom surface of the GaAs substrate is photolithographically patterned to protect all but a selected region of this surface. This exposed region is then etched in a chemical mixture (for example, citric acid, hydrogen peroxide and water will work, as will other known etching solutions for GaAs) that dissolves GaAs much faster than AlGaAs. This has the effect of etching through the GaAs substrate and stopping on the AlGaAs layer. This leaves only the AlGaAs layer suspended over the opening in the GaAs substrate. However, this approach suffers from the relatively poor selectivity of the currently available GaAs etches that results in an AlGaAs layer of non-uniform thickness, when compared to the uniformity of the GaAs layer in the first approach. In some cases, a non-uniform AlGaAs layer may not be suitable for microsensor and electronic filter applications. Nevertheless, AlGaAs is a better piezoelectric material that is GaAs. AlGaAs can be made with higher resistivity. Both these characteristics result in a higher performance piezoelectric layer when compared to GaAs. Where the higher performance of an AlGaAs suspended layer is needed, the non-uniformity of the AlGaAs suspended layer becomes less of a factor in the choice of this design.

Figure 6:
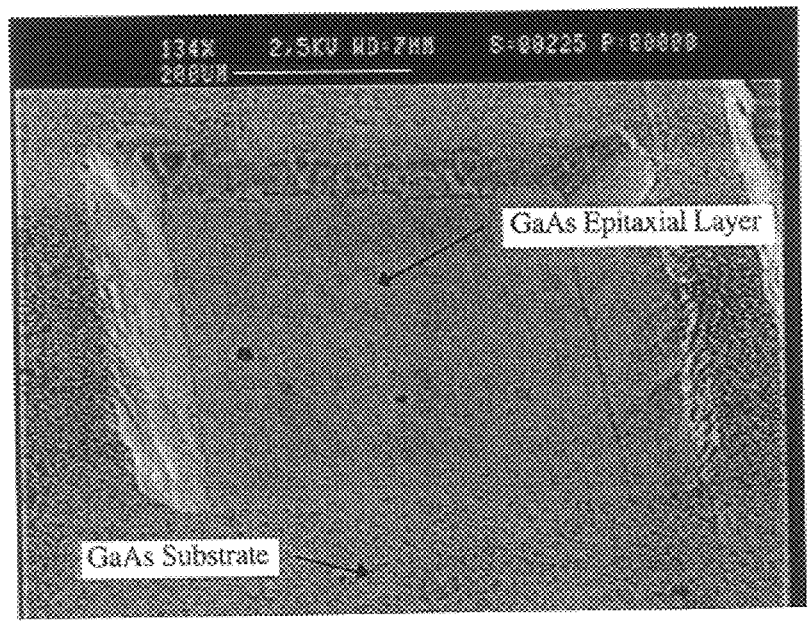
FIG. 6 is a scanning electron micrograph of a thin piezoelectric layer of GaAs, viewed from below the GaAs substrate of the same type as in FIG. 5.

Thin piezoelectric GaAs layers have been fabricated using the method of this first embodiment. FIG. 6 is a scanning electron microphotograph of the bottom side of the suspended GaAs epitaxial layer, viewed through the opening that was etched through the substrate and the AlGaAs epitaxial layers. The GaAs substrate is 100 microns thick, and the AlGaAs and GaAs epitaxial layers are each 1 micron thick. The AlGaAs layer is not visible in this view because it has been removed by etching. The opening in the substrate is about 1 mm by 1 mm.

Figure 7A:
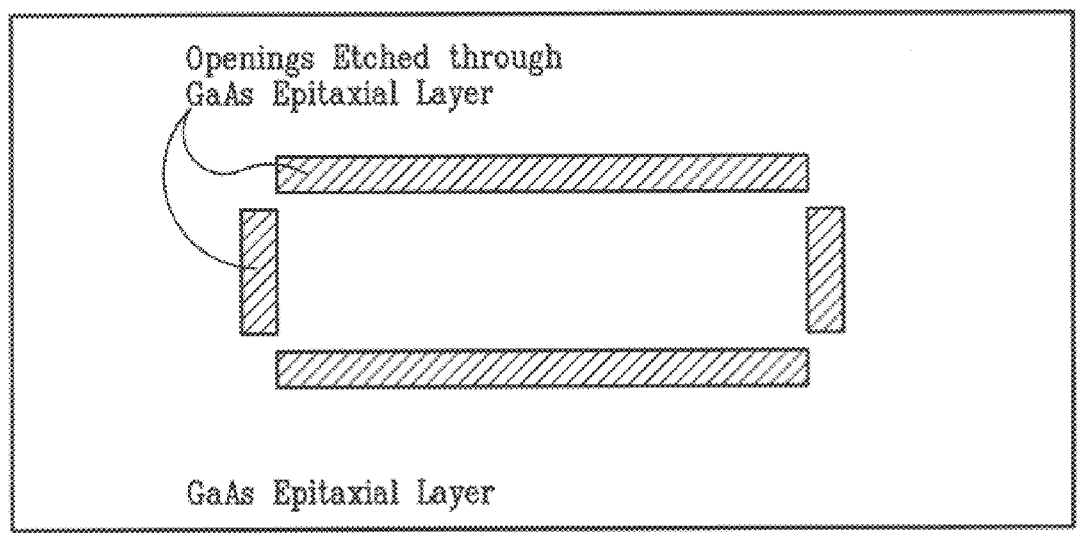
FIG. 7A is a schematic top view showing the openings etched through the top GaAs epitaxial layer; these openings will be used for a subsequent selective etch of the underlying AlGaAs layer, not shown here.
Figure 7B:
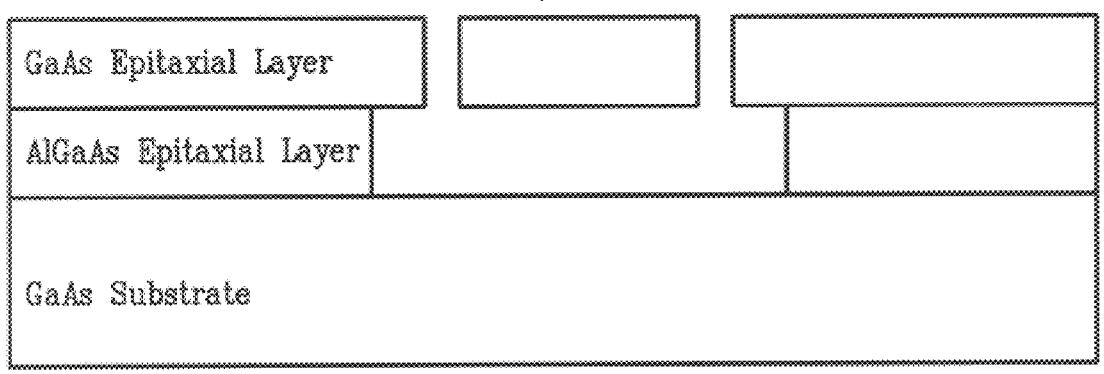
FIG. 7B is a schematic side view of the device of FIG. 7A following the selective etch of the sacrificial AlGaAs layer to produce the suspended GaAs top layer.

In a second embodiment, one etches away the AlGaAs layer by creating openings in the top GaAs epitaxial layer (instead of the GaAs substrate as is done in the first embodiment), leaving the substrate intact with the GaAs epitaxial layer suspended above it. The GaAs epitaxial layer is photolithographically patterned to protect all but small openings in the mask over the top surface of this layer. The appropriate GaAs etch solution is then applied to the mask-covered GaAs epitaxial layer with the result that corresponding small openings are created that extend through the GaAs epitaxial layer down to or through the top surface of the AlGaAs layer. A selective etchant is then used to dissolve the AlGaAs layer beneath the GaAs epitaxial layer in the regions proximate to the small openings with the effect of completely undercutting the GaAs epitaxial layer in the area when it is desired to create the suspended GaAs epitaxial layer. This technique is shown in top and side views in FIGS. 7A and 7B respectively. Metal electrodes are then deposited on the GaAs epitaxial layer. For some types of microsensors and filters, for example, microsensors based on flexural plate wave acoustic devices, it is sufficient to deposit metal only on the top surface of the GaAs epitaxial layer. This can be accomplished by any number of means widely known in the microelectronics industry. Metal deposition on both top and bottom surfaces of the GaAs epitaxial layer could be achieved with chemical vapor deposition techniques, with the edges of the GaAs epitaxial layer being treated to isolate the metal electrodes on the top and bottom surfaces. Other options might include electroless deposition on both surfaces or gas phase deposition by light activation or heating of the suspended layer, followed again by treatment to isolate the respective electrodes. An alternative approach would be to produce a thin region of conducting GaAs on the bottom of the epitaxial layer by either ion implantation techniques or by epitaxial growth of a highly doped GaAs layer during the initial epitaxial growth process.

As with the first embodiment, one can also form an AlGaAs suspended layer instead of a GaAs suspended layer by suitable modification of the process steps. For this result, one would deposit a first layer of AlGaAs onto the GaAs to act as an etch stop. A sacrificial GaAs layer would then be deposited, followed by an AlGaAs layer to act as the suspended layer in a mask-defined area of the chip. A first mask would define vias about the perimeter of the suspended area of the top AlGaAs layer. An AlGaAs selective etch would create the vias down to the sacrificial GaAs layer to be followed by a selective GaAs etch that would remove the GaAs underneath the mask-defined suspended area of the top AlGaAs layer, leaving the suspended AlGaAs layer to be patterned with electrodes as above.

One characteristic of epitaxial compound semiconductor growth that differentiates the epitaxial layers from bulk substrates of the same material is the incorporation of higher levels of impurities during growth into the epitaxial layers. These impurities have the effect of raising the electrical conductivity of the epitaxial layers, which degrades the performance of chemical microsensors and electronic filters. While epitaxial growth processes do produce materials of sufficiently low conductivity to fabricate useful microsensors and filters, improved performance would result if the conductivity could be reduced. This can be achieved through the process of ion implantation, a process that is well known in the field of microelectronics fabrication. The implantation of hydrogen or oxygen ions into the epitaxial layer that forms the sensor can bring about an improvement in performance. The implantation is performed after the epitaxial growth and in advance of other fabrication processes. This approach is well-suited to reducing the conductivity of these epitaxial layers because the ions can penetrate no more than a few microns into the surface of semiconductor materials, which is the typical thickness of the top epitaxial layer.

The selective AlGaAs etch is a critical part of the fabrication process, particularly for the second embodiment. Typically, hydrohalic acids, for example, hydrofluoric acid (HF) or hydrochloric acid (HCl), are used to selectively etch the AlGaAs. These are preferred because of their extremely high selectivity: AlGaAs etches rapidly while GaAs shows no signs of etching. However, these etchants have proven to be unsuitable for this process. During the AlGaAs etching, HF and HCl generate gaseous hydrogen ($H_2$) bubbles as a by-product. While undercutting the GaAs layer, these $H_2$ bubbles become trapped under the GaAs layer, growing larger with time, until they exert enough force on the GaAs layer to break it. This is only a problem for GaAs layers with large lateral extents because they require long etch times. These large layers, however, are required for some microsensor and filter designs. To address this problem, we have developed a novel selective etch in which HF is mixed with isopropyl alcohol, typically in a ratio of 1:1, by volume. The isopropyl alcohol reduces the surface tension of the etch mixture, making it easier for the $H_2$ bubbles to release themselves from the GaAs surfaces. With this new etchant, bubbles no longer grow large enough to break the GaAs layer. Much larger layers can be produced as a result. We find no change in the selectivity of this etch process, although the AlGaAs etch rate is reduced somewhat from that in the concentrated acid.

Isopropyl alcohol is but one of a number of surface tension reducing agents that could be utilized to solve the previously unencountered problem of breakage of the very thin suspended layer by the trapped hydrogen bubbles. Other agents could include simple alcohols such as ethanol, methanol and n-propanol. Simple glycols such as ethylene glycol should also work. Other organic and inorganic compounds will be apparent to those skilled in the art and are included within the scope of this invention. Propanol and ethanol have been used as part of etchant solutions for their usual purposes of viscosity modification, control of pH, and dissolution of other organic constituents. The prior art does not contemplate their use as surface tension reducing agents as the solution to the unexpected gas bubble problem encountered for the first time in the context of the present invention.

Figure 8A:
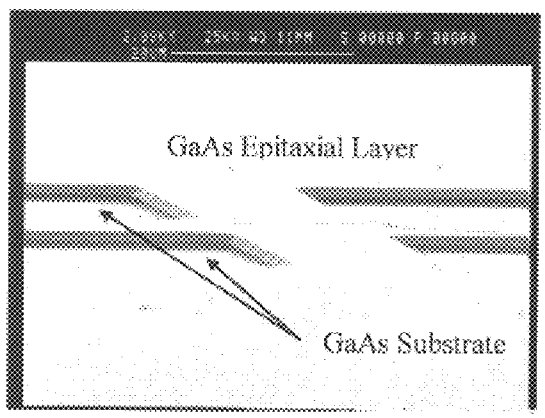
FIG. 8A is a scanning electron micrograph of a thin piezoelectric layer of GaAs, viewed from above, produced as in FIGS. 7A and 7B.
Figure 8B:
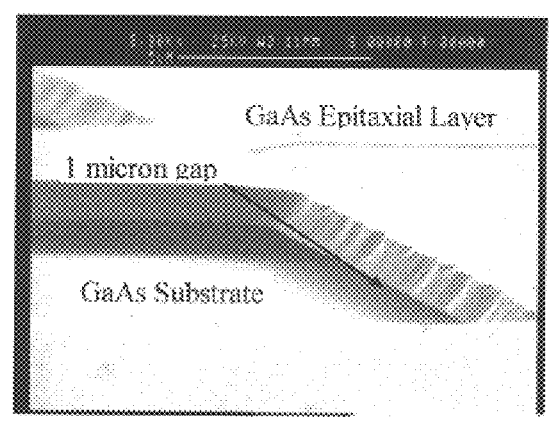
FIG. 8B is a scanning electron micrograph of a portion of the lower left opening in FIG. 8A showing how the top GaAs layer is completely undercut after the sacrificial AlGaAs layer has been selectively etched away.
Figure 9:
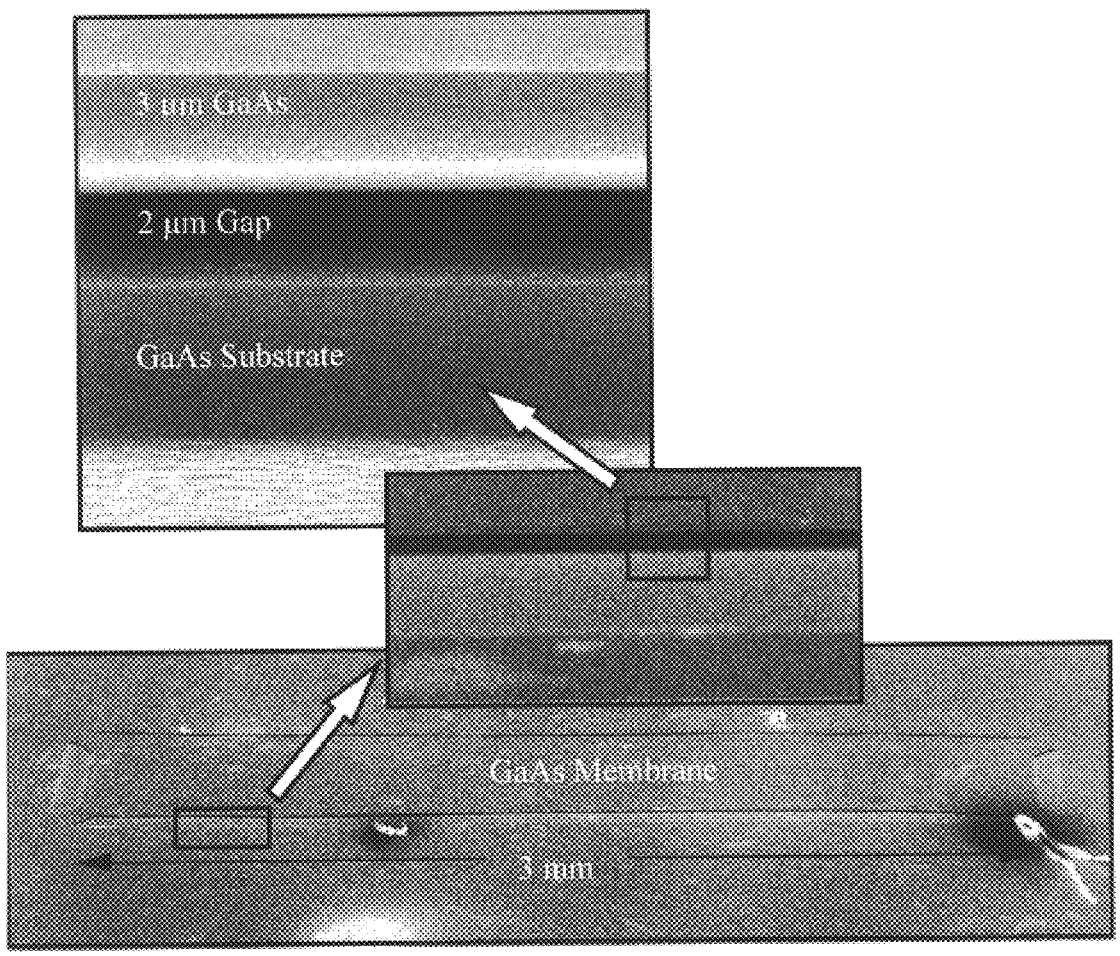
FIGS. 9A, 9B and 9C are a series of ever-larger scanning electron micrographs of a suspended thin piezoelectric layer of GaAs, viewed from above.

Thin piezoelectric layers have been fabricated using the approach of this second embodiment and are shown in the scanning electron microphotographs of FIGS. 8 and 9. In FIG. 8, the openings in the GaAs epitaxial layer are 100 microns by 100 microns. The lateral dimensions of the suspended layer are 40 microns by 240 microns. The GaAs and AlGaAs epitaxial layers are both 1.0 micron thick. The GaAs substrate is 640 microns thick. The AlGaAs layer is 50 atomic percent Al. In FIG. 9, the overall dimensions of the suspended membrane are 3 mm by 0.5 mm. The GaAs epitaxial layer is 3 microns thick. The AlGaAs layer is 2 microns thick and contains 70 atomic percent Al. The GaAs substrate is 640 microns thick. To produce suspended layers of this size requires the use of the novel HF/isopropyl alcohol etchant described above.

The ability to produce piezoelectric layers that are simultaneously exceptionally thin, sufficiently large, crystalline, and composed of compound semiconductors is the critical aspect of this invention that differentiates it from other techniques for producing thin piezoelectric films. With other techniques (surface lapping and polishing, for example) it is possible to produce crystalline layers of compound semiconductor and other piezoelectric materials but these are typically 100 times thicker than the layers described herein. It is also possible to deposit comparably thin layers of some piezoelectric materials (zinc oxide, ZnO, and aluminum nitride, AlN, are examples) through sputtering techniques. However, these layers are generally polycrystalline and do not retain the physical properties found in the bulk single-crystal materials. Mechanical strength is a particularly important property in this application. Thin polycrystalline piezoelectric films lack the intrinsic mechanical strength to be self-supporting and must be deposited onto other non-piezoelectric films to produce the types of membranes described above. In the particular case of compound semiconductors, sputtering is ineffective as a deposition technique. In fact, epitaxial growth is the only technique capable of producing thin layers of compound semiconductors that retain the important electronic, optoelectronic, piezoelectric, and mechanical properties found in the bulk materials.

The development of the selective etch that yields the GaAs layers depicted in FIGS. 7, 8 and 9 also differentiates this approach from other GaAs/AlGaAs microfabrication processes. While similar, smaller structures have been fabricated prior to this work, it has not been possible previously to produce GaAs layers suspended over the GaAs substrate with lateral dimensions as large as these. The HF/isopropyl alcohol etch described above is the advance that has enabled the fabrication of GaAs layers large enough for microsensor and high frequency electronic filter applications.

There are two principal advantages of this approach for producing high sensitivity chemical microsensors and high frequency electronic filters over competing methods. The first is the simplified fabrication scheme afforded by the use of epitaxial layers of piezoelectric compound semiconductors. The second is that it allows for significantly improved system performance through the monolithic integration of improved microsensors and electronic filters with high speed compound semiconductor microelectronics and optoelectronics.

As was discussed above, there are other methods for producing thin piezoelectric films that can be, and are being, used to produce these sensors and filters. However, these approaches require the formation of two separate thin films: one for mechanical strength and the other for piezoelectric properties. With this new approach described herein, the properties of mechanical strength and piezoelectric effect are combined in a single layer because the epitaxially deposited material retains its bulk crystalline properties. This simplified process reduces the number of process steps, thereby reducing complexity, increasing yield and lowering costs.

Monolithic integration is potentially the more significant improvement. Compound semiconductors, particularly GaAs, are the substrates of choice for high frequency, low power microelectronics and optoelectronics. Using this approach to fabricate microsensors, these devices can be built on the same substrate as the components necessary to control them, analyze the data produced and communicate the results. Using this approach to fabricate filters enables these devices to be built on the same substrate as the other elements in the electronic circuit. The advantages of monolithic integration are widely recognized and include: smaller size, greater functionality, lower power requirements, improved reliability, tighter manufacturing tolerances, and simplified packaging. Competing methods also have the potential for monolithic integration. Other types of microsensors and filters can be fabricated on GaAs substrates. However, these do not have the sensitivity or high frequency performance of this new approach. Other high sensitivity microsensors and high frequency filters can be fabricated on silicon (Si) substrates. However, Si is not as capable as GaAs for the high speed microelectronics required for integration with both these devices. Finally, other high sensitivity microsensors and high frequency filters can be fabricated on GaAs substrates with high speed GaAs microelectronics, but the fabrication complexity of this integration would make the approach unattractive by comparison. In some instances, the deposition of other piezoelectric materials, by sputtering ZnO for example, would be incompatible with the fabrication of microelectronics in either GaAs or Si because the piezoelectric material introduces impurities or the deposition process produces temperatures that degrade the performance of the microelectronics.

The invention has been described in the context of several embodiments. Variations upon the process will be apparent to those skilled in the art. The true scope of the invention is to be found in the appended claims.

What is claimed is:

1. A process for forming a very thin, crystalline, suspended layer of a first piezoelectric compound semiconductor material comprising:

forming a substrate layer of a second piezoelectric compound semiconductor material, then forming a sacrificial layer on the upper surface of the substrate layer by epitaxial deposition of a related compound semiconductor material that is lattice-matched to the second material, then forming by epitaxial deposition a very thin layer of the first material on the upper surface of the sacrificial layer, then creating at least one opening in either the substrate layer or the very thin layer to expose the adjacent surface of the sacrificial layer, the at least one opening being created with a first etchant solution that dissolves the second or first material, respectively, and then dissolving the sacrificial layer beneath a region of the very thin layer that is to form the suspended portion of the very thin layer with a second etchant that preferentially dissolves the sacrificial layer.

2. The process of claim 1 wherein the second etchant comprises a hydrohalic acid and a surface tension reducing agent.

3. The process of claim 2 wherein the hydrohalic acid is hydrofluoric acid.

4. The process of claim 2 wherein the surface tension reducing agent is isopropyl alcohol.

5. The process of claim 1 wherein GaAs is either the first or the second material.

6. The process of claim 1 wherein InGaAs is the first material.

7. The process of claim 1 wherein the sacrificial layer is $Al_xGa_{1-x}As$.

8. The process of claim 7 wherein x is at least about 0.3.

9. The process of claim 1 wherein the thickness of the very thin layer of the first material is less than about 10 μm.

10. The process of claim 9 wherein the ratio of the length to the thickness of the very thin layer is greater than 100:1.

11. The process of claim 1 additionally comprising forming electrodes on the top and bottom surfaces of the very thin suspended layer.

12. The process of claim 1 wherein the at least one opening is formed in the substrate layer, with the opening being a single opening that is approximately as large as the dimensions of the very thin suspended layer.

13. The process of claim 1 wherein the at least one opening comprises a plurality of separated small openings in the very thin layer that are formed around the perimeter of a region where the suspended portion of the very thin layer is to be formed.

14. A process for forming a very thin, crystalline, suspended layer of a first piezoelectric compound semiconductor material comprising:

forming a substrate layer of a second piezoelectric compound semiconductor material, then forming a sacrificial layer on the upper surface of the substrate layer by epitaxial deposition of a related compound semiconductor material that is lattice-matched to the second material, then forming by epitaxial deposition a very thin layer of the first material on the upper surface of the sacrificial layer, then etching an opening in the substrate layer with a first etchant solution that dissolves the second material to expose the adjacent surface of the sacrificial layer, then dissolving the sacrificial layer beneath a region of the very thin layer that is to form a suspended portion of the very thin layer with a second etchant that preferentially dissolves the sacrificial layer.

15. The process of claim 14 wherein the second etchant comprises a hydrohalic acid and a surface tension reducing agent.

16. The process of claim 15 wherein the thickness of the very thin layer of the first material is less than about 10 μm and the ratio of the length to the thickness of the very thin layer is greater than 100:1.

17. The process of claim 14 wherein the first and second materials are GaAs or InGaAs and the sacrificial layer is $Al_xGa_{1-x}As$, where x is greater than about 0.3 (30 atomic percent).

18. A process for forming a very thin, crystalline, suspended layer of a first piezoelectric compound semiconductor material comprising:

forming a substrate layer of a second piezoelectric compound semiconductor material, then forming a sacrificial layer on the upper surface of the substrate layer by epitaxial deposition of a related compound semiconductor material that is lattice-matched to the second material, then forming by epitaxial deposition a very thin layer of the first material on the upper surface of the sacrificial layer, then etching a plurality of openings in the very thin layer to define a perimeter about a region where a suspended portion of the very thin layer is to be formed, this etching being done with a first etchant solution that dissolves the first material to expose the adjacent surface of the sacrificial layer, then dissolving the sacrificial layer beneath the region of the very thin layer that is to form the suspended portion of the very thin layer with a second etchant that preferentially dissolves the sacrificial layer.

19. The process of claim 18 wherein the second etchant comprises a hydrohalic acid and a surface tension reducing agent.

20. The process of claim 18 wherein the thickness of the very thin layer of the first material is less than about 10 μm and the ratio of the length to the thickness of the very thin layer is greater than 100:1. The process of claim 17 wherein the first and second materials are GaAs or InGaAs and the sacrificial layer is $Al_xGa_{1-x}As$, where x is greater than about 0.3 (30 atomic percent).

21. A process for forming a very thin suspended piezoelectric layer of AlGaAs above a GaAs substrate comprising:

depositing a epitaxial layer of AlGaAs on the upper surface of a GaAs substrate wherein the epitaxial layer is less than about 10 μm thick;

exposing an area of the bottom surface of the substrate to an etchant that preferentially dissolves GaAs in relation to AlGaAs, wherein the area is approximately that of the size of the suspended piezoelectric layer to be formed;

etching the exposed bottom surface of the GaAs substrate until the AlGaAs is exposed in the area to form the very thin suspended piezoelectric layer of AlGaAs; and forming at least one electrode in contact with the suspended layer.

* * * * *